US008134708B2

(12) United States Patent
Wu et al.

(10) Patent No.: US 8,134,708 B2
(45) Date of Patent: Mar. 13, 2012

(54) METHOD OF MEASURING NUMERICAL APERTURE OF EXPOSURE MACHINE, CONTROL WAFER, PHOTOMASK, AND METHOD OF MONITORING NUMERICAL APERTURE OF EXPOSURE MACHINE

(75) Inventors: Chien-Min Wu, Hsinchu (TW); Chien-Chih Chen, Hsinchu (TW)

(73) Assignee: Maxchip Electronics Corp., Hsinchu (TW)

( * ) Notice: Subject to any disclaimer, the term of this patent is extended or adjusted under 35 U.S.C. 154(b) by 498 days.

(21) Appl. No.: 12/337,606

(22) Filed: Dec. 17, 2008

(65) Prior Publication Data

US 2010/0149535 A1 Jun. 17, 2010

(30) Foreign Application Priority Data

Nov. 5, 2008 (TW) .............................. 97142747 A

(51) Int. Cl.
*G01B 11/00* (2006.01)
(52) U.S. Cl. ............... 356/399; 356/124; 355/55; 430/5
(58) Field of Classification Search .......... 356/124–127, 356/399–401; 430/5, 20, 22, 30, 311; 355/53–55
See application file for complete search history.

(56) References Cited

U.S. PATENT DOCUMENTS

| 4,768,883 | A | * | 9/1988 | Waldo et al. | 356/399 |
| 5,156,982 | A | * | 10/1992 | Nagoya | 438/14 |
| 5,615,006 | A | * | 3/1997 | Hirukawa et al. | 356/124 |
| 5,751,404 | A | * | 5/1998 | Murakami et al. | 355/53 |
| 5,795,687 | A | * | 8/1998 | Yasuda | 430/22 |
| 5,837,404 | A | * | 11/1998 | Lu | 430/5 |
| 2002/0012858 | A1 | * | 1/2002 | Kawakubo et al. | 430/22 |
| 2004/0206918 | A1 | * | 10/2004 | Nakasugi | 250/491.1 |
| 2007/0170603 | A1 | * | 7/2007 | Takahashi et al. | 257/797 |

FOREIGN PATENT DOCUMENTS

JP 361207020 A * 9/1986

* cited by examiner

*Primary Examiner* — Hoa Pham
(74) *Attorney, Agent, or Firm* — Jianq Chyun IP Office

(57) ABSTRACT

A method of measuring a numerical aperture of an exposure machine is described. A control wafer having vernier marks thereon and an aberration mask having pinholes therein are provided, wherein each pinhole corresponds to a vernier mark in position. A lithography process using the exposure machine and the aberration mask is performed to the control wafer, so as to form over each vernier mark a photoresist pattern having the same shape of the illumination pattern of the light source of the exposure machine. The numerical aperture of the exposure machine is then derived from a graduation of the vernier mark corresponding to an outer edge of the photoresist pattern.

9 Claims, 4 Drawing Sheets

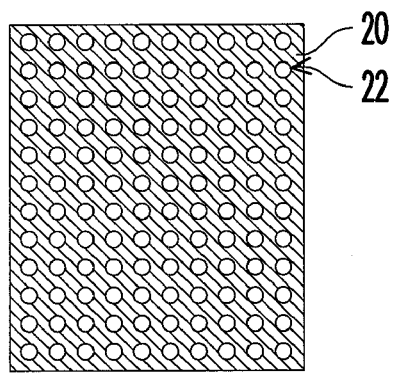
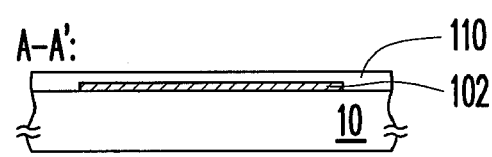
FIG. 2  FIG. 3
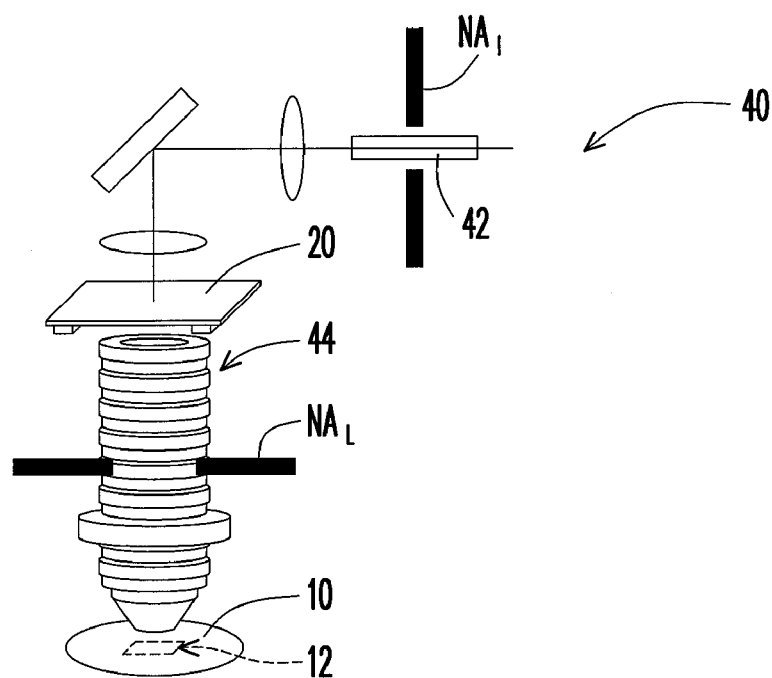
FIG. 4

METHOD OF MEASURING NUMERICAL APERTURE OF EXPOSURE MACHINE, CONTROL WAFER, PHOTOMASK, AND METHOD OF MONITORING NUMERICAL APERTURE OF EXPOSURE MACHINE

CROSS-REFERENCE TO RELATED APPLICATION

This application claims the priority benefit of Taiwan application serial no. 97142747, filed on Nov. 5, 2008. The entirety of the above-mentioned patent application is hereby incorporated by reference herein and made a part of specification.

BACKGROUND OF THE INVENTION

1. Field of the Invention

This invention relates to a lithography process, and more particularly relates to a method of measuring the numerical aperture (NA) of an exposure machine, a control wafer used in the method, a photomask for fabricating the control wafer, and a method of monitoring the NA of an exposure machine based on the above measuring method.

2. Description of Related Art

In a patterning process, the NA of the exposure machine is important since it is directly related to the resolution ($R=k_1\lambda/NA$) and the depth of focus ($DOF=k_2\lambda/NA^2$) correlated to the accuracy of the pattern transfer. Therefore, all the exposure machines used in the same IC fabrication process should have the same NA, so as to uniform the properties of the products.

However, since the NAs of the exposure machines certainly have more or less differences, the NAs are generally compensated in use to reduce the difference as far as possible. Before the compensation, the NAs of the exposure machines are respectively measured. In a conventional method, the NA of an exposure machine is measured by a TMAP instrument manufactured by LITEL Company. However, such NA measuring instrument is very expensive and therefore not popular.

SUMMARY OF THE INVENTION

In view of the foregoing, this invention provides a method of measuring a numerical aperture (NA) of an exposure machine.

This invention also provides a control wafer applicable to the above method.

This invention further provides a photomask for fabricating a control wafer, with which the control wafer can have a plurality of vernier marks thereon for the NA measurement of an exposure machine.

This invention further provides a method of monitoring an NA of an exposure machine, which is based on the method of measuring an NA of an exposure machine of this invention.

The method of measuring a NA of an exposure machine of this invention is described as follows. A control wafer and an aberration mask are provided, wherein the control wafer has a plurality of vernier marks thereon, the aberration mask has a plurality of pinholes therein, and each pinhole corresponds to a vernier mark in position. A lithography process using the exposure machine and the aberration mask is performed to the control wafer, so as to form over each vernier mark a photoresist pattern that has the same shape of the illumination pattern of the light source of the exposure machine. The NA of the exposure machine is then derived from a graduation of the vernier mark corresponding to an outer edge of the photoresist pattern.

In an embodiment, the photoresist pattern includes at least one opening formed in a positive photoresist layer on the control wafer.

In an embodiment, each vernier mark includes at least one graduated linear pattern. Each vernier mark may include an X-directional graduated linear pattern, a Y-directional graduated linear pattern, a 45° graduated linear pattern and a −45° graduated linear pattern, wherein respective centers of the four graduated linear patterns coincide with each other.

In an embodiment, the size of each vernier mark is 0.1-1.0 mm, and the pitch between any two adjacent vernier marks is 1.0-3.0 mm. In an embodiment, the pitch between two graduations in each vernier mark is 0.05-0.1 μm.

In an embodiment, the light source is an on-axis light source. In another embodiment, the light source is an off-axis light source, of which the illumination pattern is, for example, a ring-shaped illumination pattern, an X-dipolar illumination pattern, a Y-dipolar illumination pattern or a quadrupolar illumination pattern.

The photomask for fabricating a control wafer of this invention has a plurality of vernier marks thereon, each corresponding to a vernier mark on the control wafer.

The method of monitoring an NA of an exposure machine is described below. After an exposure machine is set according to the required NA, the above method of measuring an NA of an exposure machine is applied to measure the real NA of the exposure machine. The real NA is then compared to the required NA, and the exposure machine is adjusted according to the result of the comparison. Then, an NA database of exposure machine is established.

The NA database may include parameter settings corresponding to the required NA, the real NA and the results of the aforementioned comparison and adjustment.

With the method of measuring an NA of an exposure machine of this invention, the NA of an exposure machine can be easily derived without using an expensive NA measuring instrument. Therefore, the database of the NAs of the exposure machines in a factory can be established with a low cost to serve as a reference in compensating the NA of any exposure machine during the fabricating process.

In order to make the aforementioned and other objects, features and advantages of this invention comprehensible, a preferred embodiment accompanied with figures is described in detail below.

BRIEF DESCRIPTION OF THE DRAWINGS

FIGS. 1A & 2-5 illustrate a method of measuring an NA of an exposure machine according to an embodiment of this invention, wherein FIG. 1A illustrates the control wafer used in the method and the vernier marks thereon and FIG. 2 illustrates the aberration mask used in the method.

DESCRIPTION OF EMBODIMENTS

Figure 1A:
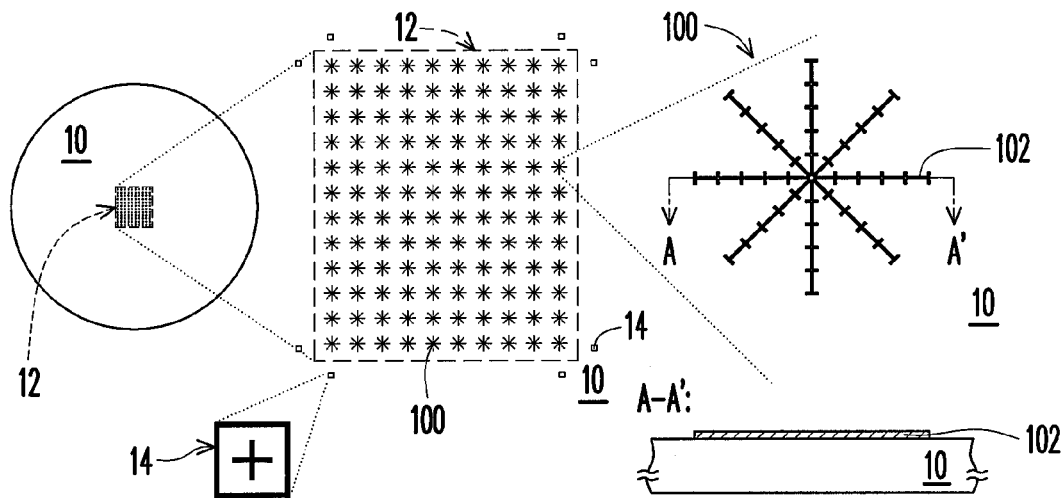

FIGS. 1A & 2-5 illustrate a method of measuring an NA of an exposure machine according to an embodiment of this invention. FIG. 1A illustrates the control wafer used in the method and the vernier marks thereon. FIG. 2 illustrates the aberration mask used in the method.

Referring to FIGS. 1A and 2, a control wafer 10 and an aberration mask 20 are provided. The control wafer 10 has thereon a plurality of vernier marks 100 arranged in a 2D array within a central region 12 thereof. The aberration mask 20 has therein a plurality of pinholes 22 that are also arranged in a 2D array, wherein each pinhole 22 corresponds to a vernier mark 100 in position.

In an embodiment, each vernier mark 100 on the control wafer 10 includes at least one graduated linear pattern, such as the graduated linear patterns 102 shown in FIG. 1A, and the material thereof is, for example, polysilicon, metal or silicon nitride. As shown in the right part of FIG. 1A, each vernier mark 100 may include an X-directional graduated linear pattern, a Y-directional graduated linear pattern, a 45° graduated linear pattern and a −45° graduated linear pattern, wherein the respective centers of the four graduated linear patterns coincide with each other. Specifically, in a planar quadrant, when the right half of the X-directional graduated linear pattern points to 0°, the other seven graduated linear half-pattern respectively point to 45°, 90° (the upper half of the Y-directional graduated linear pattern), 135°, 180° (the left half of the X-directional graduated linear pattern), 225°, 270° (the lower half of the Y-directional graduated linear pattern) and 315°, and the starting points thereof coincide with the center of the vernier mark pattern, as shown in FIG. 1A.

Moreover, the size of each vernier mark 100 is, for example, 0.1-1.0 mm, preferably 1.0 mm. The pitch between any two adjacent vernier marks 100 is, for example, 1.0-3.0 mm, preferably 2.5 mm. The pitch between two graduations in each vernier mark 100 is, for example, 0.05-0.1 μm, preferably 0.1 μm. In addition, the above graduation pitch can be varied according to the real requirements.

Moreover, one or more alignment marks 14 are preferably formed beside the central region 12 where the vernier marks 100 are formed, for aligning the control wafer 10. The alignment mark 14 may have a "+"-shaped structure and an outer frame as designed by Nikon and Canon Company, as shown in FIG. 1A. An alignment mark composed of parallel lines or other types of alignment marks may alternatively be used.

Figure 1B:
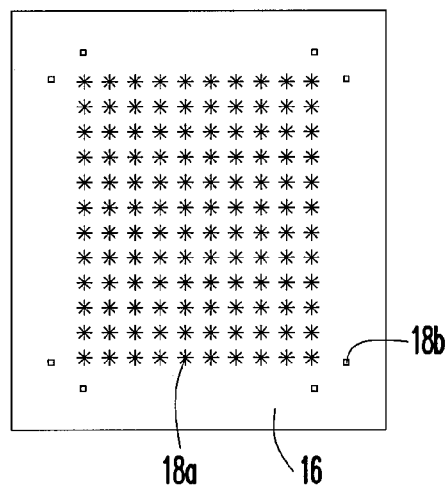
FIG. 1B illustrates a photomask for fabricating the control wafer of FIG. 1A.

Moreover, a method of forming the control wafer of this invention is as follows. A material layer for forming the vernier marks 100 is formed on a wafer. A patterning process is performed to the material layer by using a specific photomask having patterns corresponding to the above vernier marks 100, so as to form the vernier marks 100 and the alignment marks 14. The specific photomask is shown in FIG. 1B, which includes a transparent substrate 16, a plurality of vernier mark patterns 18a corresponding to the above vernier marks 100, and alignment mark patterns 18b corresponding to the above alignment marks 14. The patterning process includes photoresist coating, exposure, development and etching, etc.

Referring to FIG. 2, in an embodiment, the diameter of each pinhole 22 in the aberration mask 20 is, for example, 0.5-2.0 mm, and the pitch between any two adjacent pinholes 22 is preferably 2.5 mm. Moreover, each pinhole 22 preferably has a circular shape. Since the pinholes 22 are arranged in a 2D array, only the zero-order diffraction light can pass the aberration mask 20.

In a preferred embodiment, the size of each vernier mark 100 on the control wafer 10 is varied according to the diameter of each pinhole 22 in the aberration mask 20, or according to the real requirements. For example, the diameter of each pinhole 22 in the aberration mask 20 may be approximately the same as the size of each vernier mark 100 on the control wafer 10.

Referring to FIG. 3, a photoresist layer 110 is coated onto the control wafer 10, wherein the photoresist layer 110 may be a positive photoresist layer or a negative photoresist layer. In FIGS. 5 and 6A-6E, only the case of the positive photoresist layer is taken as an example.

Referring to FIG. 4, alignment and exposure are performed to the control wafer 10 of FIG. 1A by applying the exposure machine 40 to be measured and the aberration mask 20 of FIG. 2. The exposure machine 40 generally includes a light source 42 and a lens set 44; the numerical aperture ($NA_O$) thereof is mainly determined by the illumination numerical aperture $NA_I$ of the light source 42 and the numerical aperture ($NA_L$) of the lens set 44, satisfying the equation "$NA_O=(NA_I\times NA_L)^{1/2}$". The light source 42 may be a conventional on-axis light source or an off-axis light source, and the illumination pattern thereof is transferred to the photoresist layer 110 over a vernier mark 100 via the corresponding pinhole 22. Since only the zero-order diffraction light can pass the aberration mask 20, the illumination patterns on adjacent vernier marks 100 are not mutually interfered.

Figure 5:
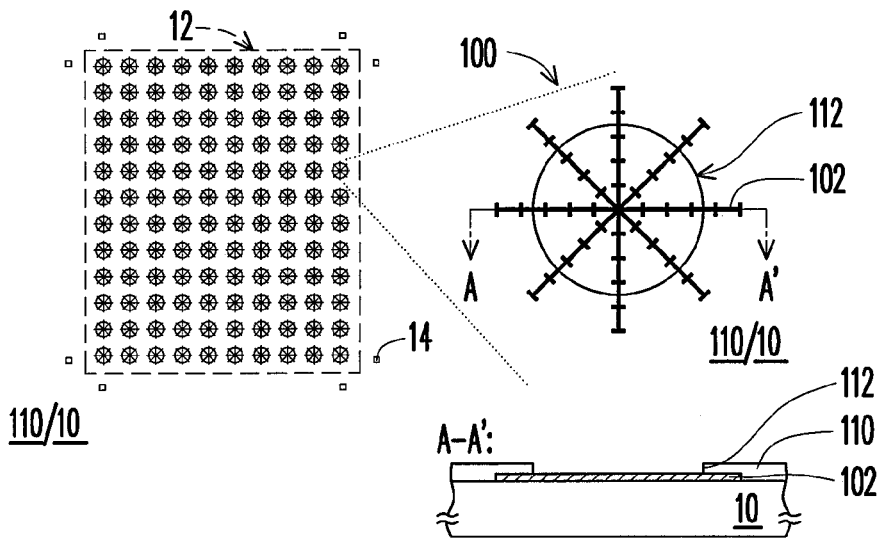

Next, referring to FIG. 5, a development step is performed to form a photoresist pattern 112 having the same shape of the illumination pattern over each vernier mark 100. When the light source 42 is an on-axis light source and the photoresist layer 110 is a positive photoresist layer, the photoresist pattern 112 is an opening in the photoresist layer 110. Then, the control wafer 10 is moved to an after-develop inspection (ADI) machine for observing a graduation of the vernier mark 100 corresponding to an outer edge of the photoresist pattern 112, so as to derive the NA of the exposure machine 40.

For example, when the NA corresponding to the 100-th graduation of a graduated linear pattern of the vernier mark 100 counted from the zero point is 1.00 and the outer edge of the photoresist pattern 112 corresponds to the 93-th graduation counted from the zero point, the NA of the exposure machine 40 is calculated as 0.93.

Moreover, in designing the vernier mark 100, the positions of the graduations can be determined using an exposure machine with a known NA and the same aberration mask. For example, when the radius of a circular opening formed with an exposure machine of NA=0.5 and the same aberration in a positive photoresist layer on a test wafer is 0.5 mm as well as the 100-th graduation of a graduated linear pattern of the vernier mark 100 counted from the zero point is intended to indicate NA=0.5, the n-th graduation should be positioned (n×0.5/100) mm apart from the zero point.

Moreover, when the light source of the exposure machine is an off-axis light source, the shape of the photoresist pattern depends upon the illumination pattern of the off-axis light source. Common off-axis illumination patterns include ring-shaped illumination pattern, X-dipolar illumination pattern, Y-dipolar illumination pattern and quadrupolar illumination pattern, etc. FIGS. 6A-6E illustrate various photoresist patterns on vernier marks according to other embodiments of this invention, wherein the photoresist patterns correspond to various off-axis illumination patterns.

Figures 6A, 6B, 6C:
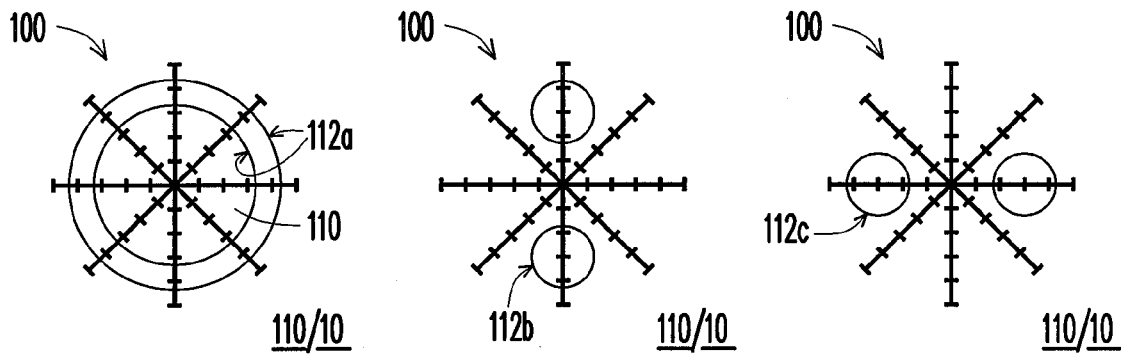
FIGS. 6A-6E illustrate various photoresist patterns on vernier marks according to other embodiments of this invention, wherein the photoresist patterns correspond to various off-axis illumination patterns.

Referring to FIG. 6A, the photoresist pattern includes a ring-shaped opening 112a in the photoresist layer 110, which corresponds to an off-axis light source having a ring-shape illumination pattern.

Referring to FIG. 6B, the photoresist pattern includes two openings 112b arranged in the Y-direction in the photoresist layer 110, which correspond to an off-axis light source having a Y-dipolar illumination pattern.

Referring to FIG. 6C, the photoresist pattern includes two openings 112c arranged in the X-direction in the photoresist layer 110, which correspond to an off-axis light source having an X-dipolar illumination pattern.

Figures 6D, 6E:
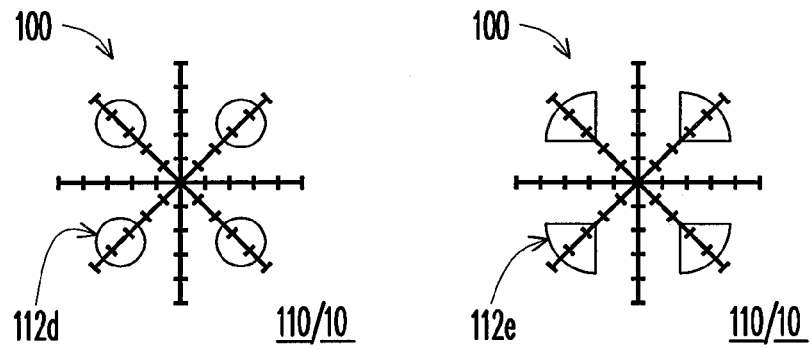

Referring to FIGS. 6D-6E, the photoresist pattern includes four circular openings 112d or four fan-shaped openings 112e at the 45° direction and arranged symmetrically, which correspond to an off-axis light source having a quadrupolar illumination pattern.

Similarly, by observing the graduations of the vernier marks 100 corresponding to outer edges of the photoresist patterns 112a, 112b, 112c, 112d or 112e, the NA of the exposure machine can be derived.

Figure 7:
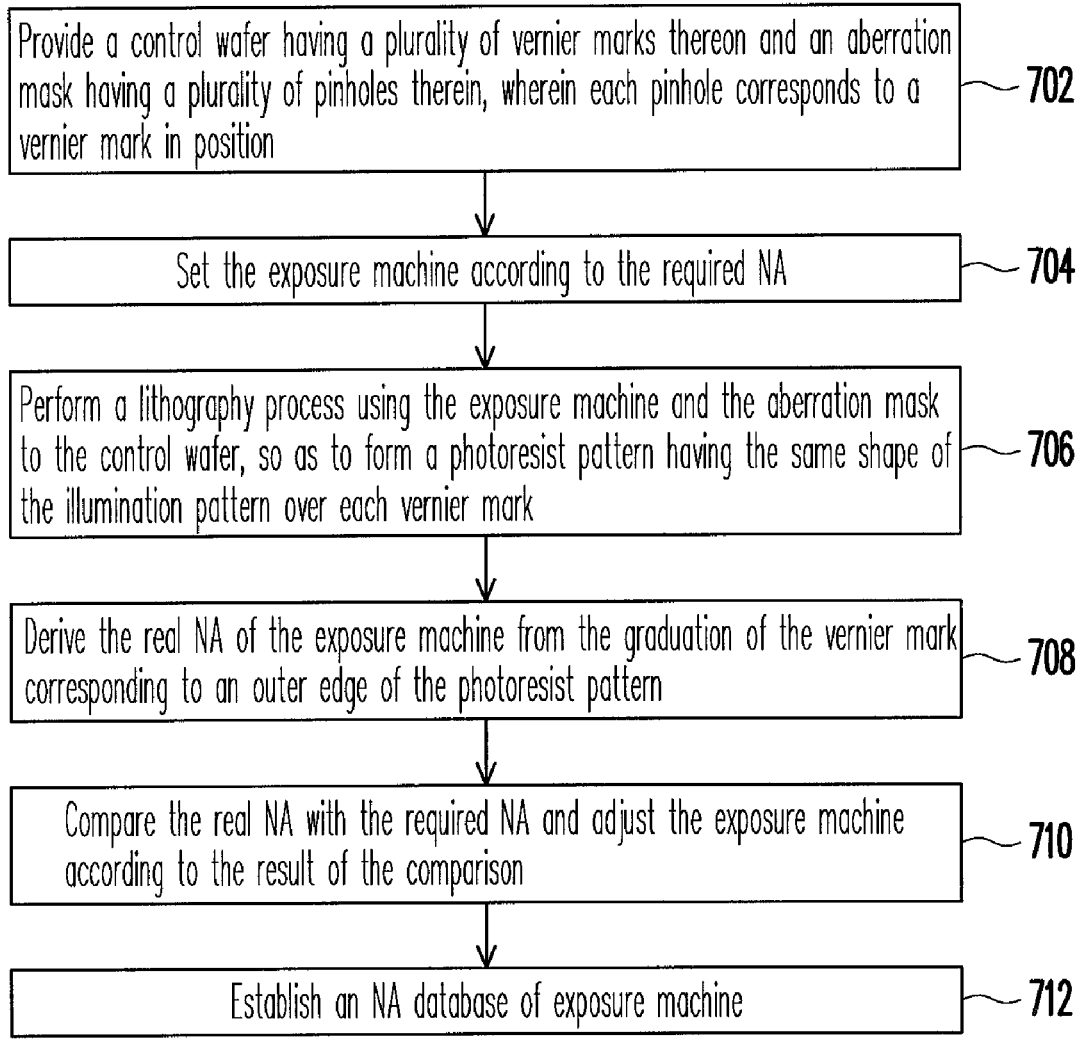
FIG. 7 is a flowchart illustrating a method of monitoring an NA of an exposure machine according to an embodiment of this invention.

FIG. 7 is a flowchart illustrating a method of monitoring an NA of an exposure machine according to an embodiment of this invention, wherein the light source of the exposure machine has an illumination pattern.

In step 702, a control wafer having a plurality of vernier marks thereon and an aberration mask having a plurality of pinholes therein are provided, wherein each pinhole corresponds to a vernier mark in position. The control wafer and the aberration mask are, for example, those shown in FIGS. 1A and 2. Please refer to FIGS. 1A and 2 for detailed descriptions thereof.

In step 704, the exposure machine is set according to the required NA, wherein the aforementioned illumination NA ($NA_I$) and the NA ($NA_L$) of the lens set may be set. It is noted that the executing sequence of the step 704 and the step 702 may be reversed.

In step 706, a lithography process using the exposure machine and the aberration mask is performed to the control wafer, so as to form a photoresist pattern having the same shape of the illumination pattern over each vernier mark. Such step corresponds to FIGS. 3-5, and is described in details in the related paragraphs.

In step 708, the real NA of the exposure machine is derived from a graduation of the vernier mark corresponding to an outer edge of the photoresist pattern. Such step corresponds to FIG. 5, and is described in details in the related paragraphs.

In step 710, the real NA is compared with the required NA, and the exposure machine is adjusted according to the result of the comparison such that the NA thereof is closer to the required NA. The adjustment method is exemplified below. When the required NA of the exposure machine is 0.50 μm and the real NA measured is 0.48 μm, 0.02 μm is set as the compensation value according to their comparison.

In step 712, an NA database of exposure machine is established, which may include parameter settings corresponding to the required NA, the real NA, and the results of the above comparison and adjustment.

As described above, by using the method of measuring an NA of an exposure machine of this invention, the NA of an exposure machine can be easily derived without using an expensive NA measuring instrument. Therefore, a database of the NAs of the exposure machines in a factory can be established with a low cost to serve as a reference in compensating the NA of any exposure machine during the fabricating process.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of measuring a numerical aperture (NA) of an exposure machine, wherein a light source of the exposure machine has an illumination pattern, the method comprising:
   providing a control wafer having a plurality of vernier marks thereon;
   providing an aberration mask having a plurality of pinholes therein, wherein each pinhole corresponds to a vernier mark in position;
   performing a lithography process using the exposure machine and the aberration mask to the control wafer, so as to form a photoresist pattern having the same shape of the illumination pattern over each vernier mark; and
   deriving the NA of the exposure machine from a graduation of the vernier mark corresponding to an outer edge of the photoresist pattern.

2. The method of claim 1, wherein the photoresist pattern comprises at least one opening formed in a positive photoresist layer on the control wafer.

3. The method of claim 1, wherein each of the vernier marks comprises at least one graduated linear pattern.

4. The method of claim 3, wherein each of the vernier marks comprises an X-directional graduated linear pattern, a Y-directional graduated linear pattern, a 45° graduated linear pattern and a −45° graduated linear pattern, wherein respective centers of the four graduated linear patterns coincide with each other.

5. The method of claim 1, wherein the light source is an on-axis light source.

6. The method of claim 1, wherein the light source is an off-axis light source.

7. The method of claim 6, wherein the illumination pattern of the off-axis light source is a ring-shaped illumination pattern, an X-dipolar illumination pattern, a Y-dipolar illumination pattern or a quadrupolar illumination pattern.

8. A method of monitoring a numerical aperture (NA) of an exposure machine, wherein a light source of the exposure machine has an illumination pattern, the method comprising:
   providing a control wafer having a plurality of vernier marks thereon;
   providing an aberration mask having a plurality of pinholes therein, wherein each pinhole corresponds to a vernier mark in position;
   setting the exposure machine according to a required NA;
   performing a lithography process using the exposure machine and the aberration mask to the control wafer, so as to form a photoresist pattern having the same shape of the illumination pattern over each vernier mark;
   deriving a real NA of the exposure machine from a graduation of the vernier mark corresponding to an outer edge of the photoresist pattern;
   comparing the real NA with the required NA and adjusting the exposure machine according to a result of the comparison; and
   establishing an NA database of exposure machine.

9. The method of claim 8, wherein the NA database includes parameter settings corresponding to the required NA, the real NA, the result of the comparison and a result of the adjustment of the exposure machine.

* * * * *